United States Patent [19]

Higashiguchi et al.

[11] Patent Number: 5,783,865
[45] Date of Patent: Jul. 21, 1998

[54] WIRING SUBSTRATE AND SEMICONDUCTOR DEVICE

[75] Inventors: Yutaka Higashiguchi; Mitsuo Inagaki; Makoto Totani; Yasuhiro Teshima; Hiroshi Iimura, all of Kawasaki, Japan

[73] Assignee: Fujitsu Limited

[21] Appl. No.: 602,423

[22] Filed: Feb. 16, 1996

[30] Foreign Application Priority Data

Jul. 31, 1995 [JP] Japan ................................. 7-195455

[51] Int. Cl.⁶ .......................... H01L 23/48; H01L 23/52; H01L 29/40
[52] U.S. Cl. ........................... 257/774; 257/778; 257/780
[58] Field of Search ......................... 257/738, 774, 257/778, 700, 703, 780; 361/760, 774

[56] References Cited

U.S. PATENT DOCUMENTS

| | | | |
|---|---|---|---|
| 4,617,730 | 10/1986 | Geldermans et al. | 257/774 |
| 4,987,478 | 1/1991 | Braun et al. | 257/774 |
| 5,012,386 | 4/1991 | McShane et al. | 257/700 |
| 5,075,965 | 12/1991 | Carey et al. | 29/840 |
| 5,641,945 | 6/1997 | Abe et al. | 174/261 |
| 5,646,442 | 7/1997 | Abe et al. | 257/697 |
| 5,702,255 | 12/1997 | Murphy et al. | 439/71 |

FOREIGN PATENT DOCUMENTS

| | | | |
|---|---|---|---|
| 52-38884 | 3/1977 | Japan | 257/738 |
| 63-266861 | 11/1988 | Japan. | |
| 2-170444 | 7/1990 | Japan. | |
| 3-297193 | 12/1991 | Japan. | |
| 5-175275 | 7/1993 | Japan. | |
| 6-097345 | 4/1994 | Japan. | |
| 6-112354 | 4/1994 | Japan. | |

*Primary Examiner*—Teresa M. Arroyo
*Attorney, Agent, or Firm*—Staas & Halsey

[57] ABSTRACT

A wiring substrate has a semiconductor device mounted thereonto, the semiconductor device having ball-shaped externally connecting parts. The wiring substrate includes through holes at positions corresponding to the ball-shaped externally connecting parts and electric conductors provided inside and around the through holes. Land portions of the electric conductors, at which the electric conductors are engaged with the externally connecting parts, includes sectional tapering portions, respectively. Further, the through holes have sectional tapering portions at edge portions in proximity to the land portions, respectively. The ball-shaped externally connecting parts of the semiconductor device are engaged with the land portions provided around the through holes of the wiring substrate and having the sectional tapering portions, respectively.

7 Claims, 13 Drawing Sheets

WIRING SUBSTRATE AND SEMICONDUCTOR DEVICE

BACKGROUND OF THE INVENTION

1. Field of the Invention

The present invention relates to a semiconductor device in which a wiring substrate supports electronic parts such as semiconductor chips, and, in particular, to a ball-grid-array (hereinafter abbreviated to a 'BGA')-type semiconductor device. In detail, the present invention relates to a BGA-type semiconductor device having an arrangement resulting from consideration of an assembling efficiency and a maintenance efficiency of the BGA-type semiconductor device.

Recently, high-density semiconductor chips are being fabricated, and also high-density packaging in a semiconductor device is being demanded.

For this purpose, a BGA-type semiconductor device has received attention. The BGA-type semiconductor device has features which will now be described. In comparison to a QFP (Quad Flat-Leaded Package)-type semiconductor device, ball-shaped externally-connecting terminals can be provided to form an array with wider pitches on a rear surface of a semiconductor device, and also the terminals hardly deformed.

In the QFP-type semiconductor device, externally-connecting terminals are provided along an edge of the semiconductor device. Therefore, positioning the semiconductor device on a mother board (which may be referred to as a printed-circuit board, a circuit card, a wiring substrate, simply a substrate, or the like) is relatively easy. Further, removing the semiconductor device from the mother board after the semiconductor device is mounted on the mother board for actual use is relatively easy.

However, in the BGA-type semiconductor device, the ball-shaped externally-connecting terminals are provided so as to form the array on the entirety or a part of the rear surface of semiconductor device. Therefore, positioning the semiconductor device on the mother board and removing the semiconductor device from the mother board are very difficult. The present invention is designed to solve this problem.

2. Description of the Related Art

With reference to FIG. 1, a BGA-type semiconductor device in the related art will now be simply described. The BGA-type semiconductor device 10 shown in FIG. 1 has a base 12 having electric wiring provided thereon, a semiconductor chip (LSI chip) 14 as a bare chip, a sealing unit 16 and ball-shaped SnPb solder bumps 18. Electric terminals (not shown in the figure) provided on the semiconductor chip 14 are bonded with electric terminals provided on a front surface of the base 12 using electric wires. The electric terminals provided on the front surface of the base 12 are electrically connected with the solder bumps 18 provided on a rear surface of the base 12 via wiring layers and/or through holes formed inside the base 12. The semiconductor chip 14 and the front surface of the base 12 are sealed by the sealing unit 16. The solder bumps 18 act as externally connecting parts (electric terminals) and are arranged on the rear surface of the base 12 so as to form a matrix. Generally speaking, a space between adjacent solder bumps 18 is not longer than 1.5 mm.

This BGA-type semiconductor device 10 can be mounted on a mother board 20 which is a glass epoxy substrate. The mother board 20 has electric terminals 22 arranged so as to form a matrix thereon and electric wiring thereon. The solder bumps 18 are soldered to the electric terminals on the mother board 20 after the bumps 18 come into contact with the electric terminals of the mother board 20.

However, in the BGA-type semiconductor device 10 shown in FIG. 1, the ball-shaped bumps (terminals) 18 are formed on the entirety of the rear surface of the semiconductor device 10. Therefore, it is difficult to accurately position the bumps 18 onto the electric terminals 22. Further, in particular, it is difficult to ascertain a connection state of internal bumps 18 externally. Further, after the BGA-type semiconductor device 10 is fixed onto the mother board 20, it is very difficult to remove the semiconductor device 10 from the mother board 20. If the removal cannot easily be performed, problems may occur in a case where replacement of the semiconductor device 10 is needed due to a malfunction of the semiconductor device 10 or a similar case.

SUMMARY OF THE INVENTION

An object of the present invention is to solve the problems mentioned above, enable easy positioning of the BGA-type semiconductor device, and enable easy removal of the semiconductor device from a substrate after the semiconductor device is mounted on the substrate for actual use.

A wiring substrate, according to the present invention, has a semiconductor device mounted thereonto, the semiconductor device having a ball-shaped externally connecting part. The wiring substrate comprises a through hole at a position corresponding to the ball-shaped externally connecting part and an electric conductor provided inside and around the through hole. A land portion of the electric conductor, at which the electric conductor is engaged with the externally connecting part, comprises a sectional tapering portion.

Further, the through hole may have a sectional tapering portion at an edge portion in proximity to the land portion.

In this structure, the ball-shaped externally connecting part of the semiconductor device is engaged with the land portion provided around the through hole of the wiring substrate and having the sectional tapering portion. Thereby, positioning of the semiconductor device on the wiring substrate can easily be performed. As a result, it is possible to mount the semiconductor device onto the wiring substrate not only automatically but also manually. Further, by using such a mounting structure, the semiconductor device is prevented from being displaced on the wiring substrate after being mounted thereon. Thereby, a work performed on the semiconductor device and the wiring substrate in the mounted state can easily be performed.

Further, after soldering the ball-shaped externally connecting part to the land portion, it is possible to observe an inside portion of the through hole from the rear surface of the wiring substrate. Thus, whether or not the soldering has been performed sufficiently can be determined.

Another wiring substrate, according to the present invention, also has a semiconductor device mounted thereonto, the semiconductor device having a ball-shaped externally connecting part. The wiring substrate comprises a plurality of lands provided thereon at positions corresponding to the ball-shaped externally connecting part and an insulation layer provided between adjacent lands of the plurality of lands. A height of the insulation layer is higher than that of the lands.

In this structure, the ball-shaped externally connecting part of the semiconductor is engaged with a land provided in a region surrounded by the insulation layer. Thus, the positioning can easily be performed. As a result, it is possible to mount the semiconductor device onto the wiring substrate not only automatically but also manually.

Further, by using such a mounting structure, the semiconductor device is prevented from being displaced on the wiring substrate after being mounted thereon. Thereby, a work performed on the semiconductor device and the wiring substrate in the mounted state can easily be performed. Further, the insulation layer prevents solder bridging.

Another wiring substrate according to the present invention has a semiconductor device mounted thereonto, the semiconductor device having a ball-shaped first externally connecting part. The wiring substrate comprises a land which is provided on a first surface thereof and can be engaged with the first externally connecting part, a ball-shaped second externally connecting part provided on a second surface of the wiring substrate, an electric conductor which connects the land with the second externally connecting part, and a heat generating element provided on the second surface and around the second externally connecting part.

By using this arrangement, by causing an electric current to flow through the heat generating element, the externally connecting part is softened. Thus, the wiring substrate which has the semiconductor device mounted thereon can easily be removed from the semiconductor device at a mounted surface.

Another wiring substrate according to the present invention has a semiconductor device mounted thereonto, the semiconductor device having a ball-shaped externally connecting part. The wiring substrate comprises a through hole at a position corresponding to the ball-shaped externally connecting part and an electric conductor provided inside and around the through hole. The through hole comprises a first portion which is engaged with the externally connecting part and a second portion which is provided further into the wiring substrate than the first portion and has a width narrower than that of the externally connecting part.

Another wiring substrate according to the present invention has a semiconductor device mounted thereonto, the semiconductor device having a ball-shaped externally connecting part. The wiring substrate comprises a through hole at a position corresponding to the ball-shaped externally connecting part and an electric conductor provided inside and around the through hole. The through hole comprises a first portion which is engaged with the externally connecting part and a second portion which is provided further into the wiring substrate than the first portion and has a width wider than that of the externally connecting part.

In these structures, the ball-shaped externally connecting part is engaged with the first portion of the through hole. Thereby, positioning of the semiconductor device on the wiring substrate can easily be performed. As a result, it is possible to mount the semiconductor device onto the wiring substrate not only automatically but also manually. Further, by using such a mounting structure, the semiconductor device is prevented from being displaced on the wiring substrate after being mounted thereon. Thereby, a work can easily be performed on the semiconductor device and the wiring substrate in the mounted state.

Further, after soldering the ball-shaped externally connecting part to the electric conductor, it is possible to observe an inside portion of the through hole from the rear surface of the wiring substrate. Thus, whether or not the soldering has been performed sufficiently can be determined.

A semiconductor device according to the present invention, comprises:

an electronic component;

a base supporting the electronic component and a pad;

an externally connecting part mounted on the base and electrically connected with the electronic component;

a bonding wire connecting between the electronic component and the pad; and a resin sealing the electronic component;

wherein the base comprises a first surface at which the electronic component is mounted and a second surface at which the pad is formed; and the second surface is lower than the first surface.

The base may further comprise a third surface at which another pad is provided, the third surface being lower than the second surface.

In this arrangement, a position of the pad which is connected with the electronic component through wire bonding is lower than a surface on which the electronic component is mounted. Thereby, if void occurs in the resin, it does not apply any substantial stress to the wire bonding.

A corner portion of the base at which the third surface borders another surface may be rounded. As a result of rounding of the corner portion, void occurrence can be effectively restricted.

Another semiconductor device according to the present invention comprises:

a base supporting an electronic component; and a ball-shaped externally connecting part mounted on the base; and a heat generating element being provided around the externally connecting part.

The semiconductor device may comprises:

an electric terminal provided on a surface other than a surface on which the heat generating element is provided; and an electric conductor connecting between the electric terminal and the heat generating element.

In this arrangement, by causing an electric current to flow through the heat generating element, the externally connecting part is softened and thereby it is easy to remove the semiconductor device from the wiring substrate.

In a method of removing a semiconductor device from a wiring substrate, according to the present invention, the semiconductor device and wiring substrate initially in a state in which externally connecting parts provided on a bottom surface of the semiconductor device in a matrix formation are soldered onto the wiring substrate. The method comprises the steps of:

a) dipping the semiconductor device in a molten solder and thus heating the semiconductor device, thereby a portion of the semiconductor device at which the wiring substrate was soldered with the semiconductor device being melted; and b) removing the semiconductor device from the wiring substrate.

In another method of removing a semiconductor device from a wiring substrate, according to the present invention, the semiconductor device and wiring substrate also have been in a state in which externally connecting parts provided on a bottom surface of the semiconductor device in a matrix formation are soldered onto the wiring substrate. However, the method comprises the steps of:

a) dipping the wiring substrate in a molten solder and thus heating the semiconductor device, thereby a portion of the semiconductor device at which the wiring substrate was soldered with the semiconductor device being melted; and b) removing the semiconductor device from the wiring substrate.

In these methods, by causing the externally connecting part to melt, it is easy to remove the semiconductor device from the wiring substrate.

A semiconductor device manufacturing method according to the present invention comprises steps of:

a) forming a plurality of regions to be bases of a plurality of semiconductor devices from a sheet of substrate; and b) dividing the substrate after mounting predetermined components on the plurality of regions.

Thereby, only a single manufacturing line is required for manufacturing the plurality of semiconductor devices simultaneously.

Other objects and further features of the present invention will become more apparent from the following detailed description when read in conjunction with the accompanying drawings.

DESCRIPTION OF PREFERRED EMBODIMENTS

Embodiments of the present invention will now be described.

Figure 2:
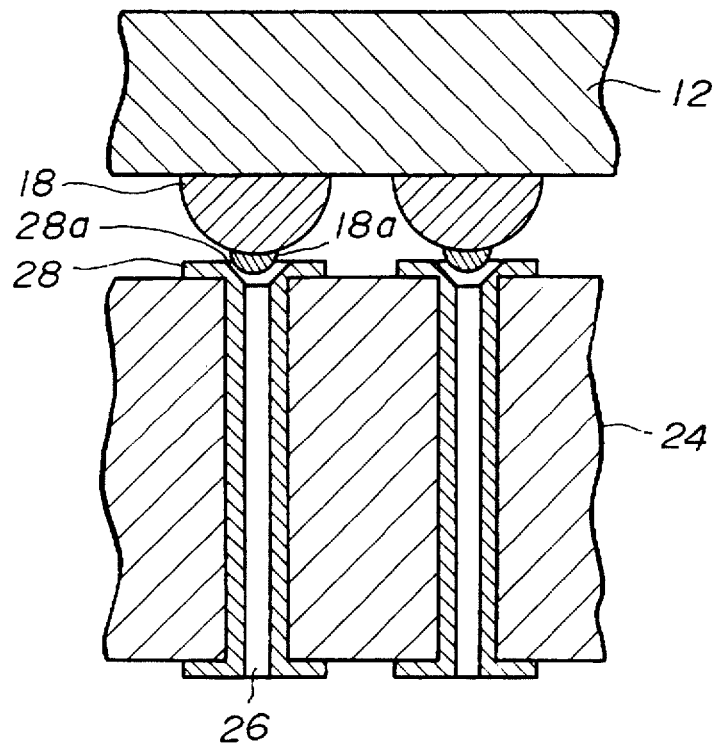
FIG. 2 shows a partial sectional view of a wiring substrate in a first embodiment of the present invention and a BGA-type semiconductor device mounted on the wiring substrate.

FIG. 2 shows a partial sectional view of a first embodiment of the present invention. The first embodiment has features in a BGA-type semiconductor device and a mother board (hereinafter referred to as 'a wiring substrate'). The features, which will be described later, enable easy and sure positioning of the BGA-type semiconductor device on the wiring substrate.

Figure 1:
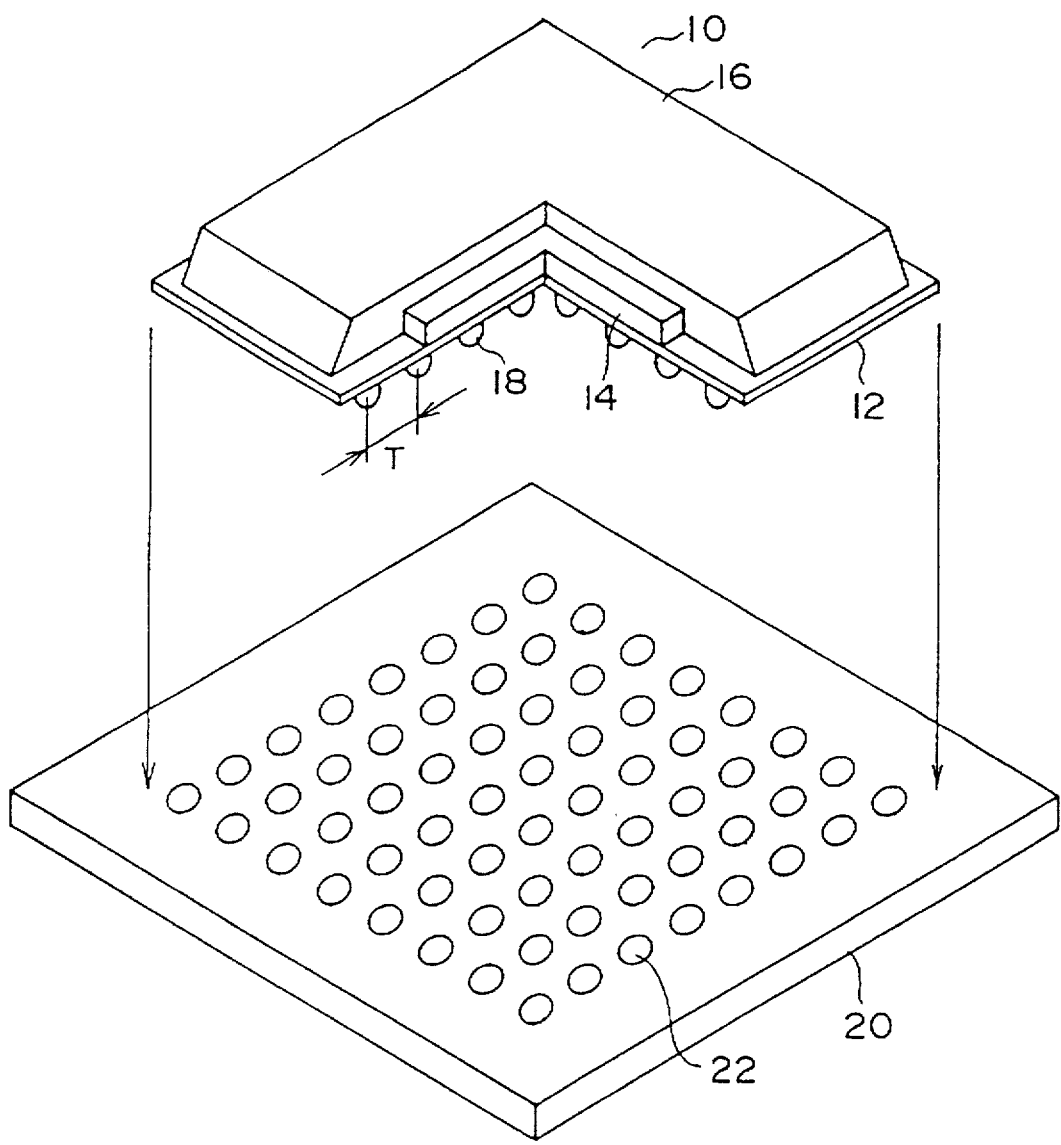
FIG. 1 illustrates a BCA-type semiconductor device in the related art.

In FIG. 2, array-like arranged solder bumps 18 are provided on a base (formed of an insulation material such as a glass epoxy or the like) 12 of the BGA-type semiconductor device. Although the solder bumps 18 are provided on lands, the lands and solder bumps are integrally indicated. In the BGA-type semiconductor device in the first embodiment shown in FIG. 2, a projection 18a is provided on a top of each solder bump 18 and thus is different from the semiconductor device 10 shown in FIG. 1. For example, the solder bumps 18 are formed of copper or the like and the projections 18a are formed of a solder having a melting point (for example, Sn, Pb+$Bi_{15}$ having melting points of 120° through 160° C.) lower than the melting point (183° C.) of the copper. In another example, the projections 18a are formed of an alloy of nickel and aluminum. After the solder bumps 18 are formed, the projections 18a are formed.

A wiring substrate 24, which is made of glass epoxy or the like and has the BGA-type semiconductor device 12 mounted thereonto, has through holes 26 having an arrangement corresponding to an arrangement of the solder bumps 18 formed on the BGA-type semiconductor device 12. A connection electric conductor 28 is formed on an inner wall, a front surface (a surface onto which the BGA-type semiconductor device is mounted) side and a rear surface side of each through hole 26. The connection electric conductors 28 are formed, for example, as a result of copper plating. Portions of each connection electric conductor exposed on the front and rear sides of the wiring substrate 24 are, for example, ring-shaped, respectively. These portions act as externally-connecting portions (referred to as 'lands', pads or foot prints).

A portion (top land) of each connection electric conductor 28 exposed at the front surface of the wiring substrate 24 has a tapered tapering portion 28a as shown in FIG. 2. The projections 18a of the solder bumps 18 are fitted into the tapering portions 28a, respectively.

Figure 3:
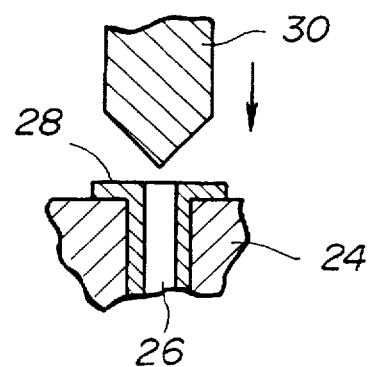
FIG. 3 shows a process in which the wiring substrate shown in FIG. 2 is machined.

As shown in FIG. 3, a point tapering jig 30 is pressed onto each through hole 26 after copper is plated inside and outside the through hole 26. As a result, a shape of a corner portion of the connection electric conductor 28 is changed so as to taper. Thus, each tapering portion 28a is formed. Instead of this method, it is also possible to chamfer the corner portion of the connection electric conductor 28 in use of an appropriate jig so as to form each tapering portion 28a.

When the BGA-type semiconductor device 12 is mounted onto the wiring substrate 24, the projections 18a are engaged with the top lands having the tapering portions 28a. Thereby, positioning of the BGA-type semiconductor device 12 on the wiring substrate 24 can easily be performed. As a result, it is possible to mount the BGA-type semiconductor device 12 onto the wiring substrate 24 not only automatically but also manually. Further, by using such a mounting structure, the BGA-type semiconductor device 12 is prevented from being displaced on the wiring substrate 24 after being mounted thereon. Thereby, a work can easily be performed on the BGA-type semiconductor device 12 and the wiring substrate 24 in the mounted state.

Further, after soldering the solder bumps 18 to the top lands of the connection electric conductors 28 respectively, it is possible to observe an inside portion of each through hole 26 from the rear surface of the wiring substrate 24.

Thus, whether or not the soldering has been performed sufficiently can be determined.

Further, the solder bumps 18 are surely engaged with the top lands of the connection electric conductors 28 respectively in this mounting structure. As a result, it is possible to perform soldering only using flux without using soldering paste printed.

Further, the wiring substrate 24 may be either a single layer one or a multiple layer one.

Figure 4:
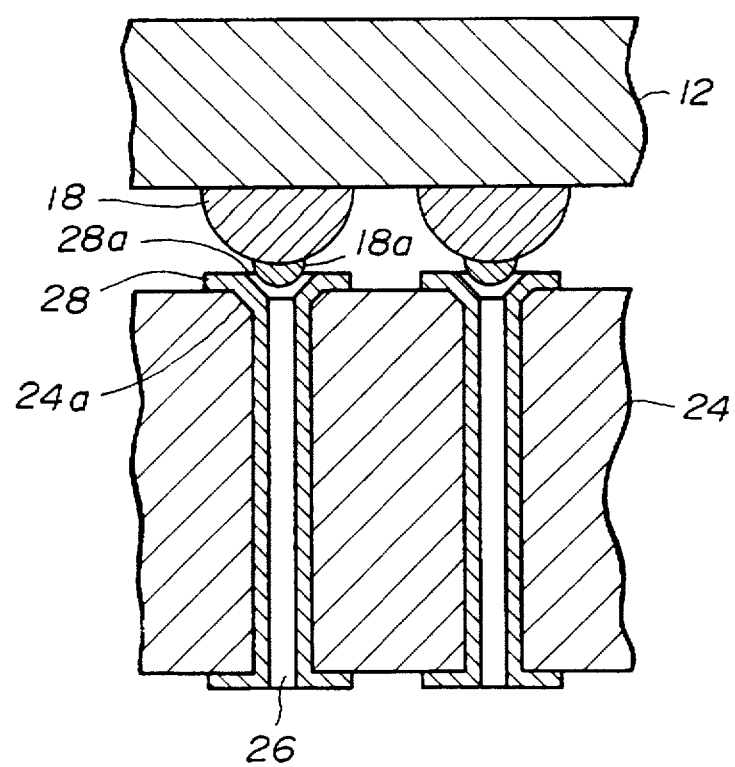
FIG. 4 shows a sectional view indicating a variant example of the first embodiment of the present invention.

FIG. 4 shows a variant example of the structure shown in FIG. 2. In this variant example, the front side portion of each through hole 24 of the wiring substrate 24 has a tapering shape. Thereby, when copper is plated inside and outside the through hole 24, the tapering portion 28a is automatically formed at the top land of each connection electric conductor 28. Similar to the structure shown in FIG. 2, it is also possible to easily perform positioning of the BGA-type semiconductor device 12 on the wiring substrate 24 in the mounting structure shown in FIG. 4.

Figure 5:
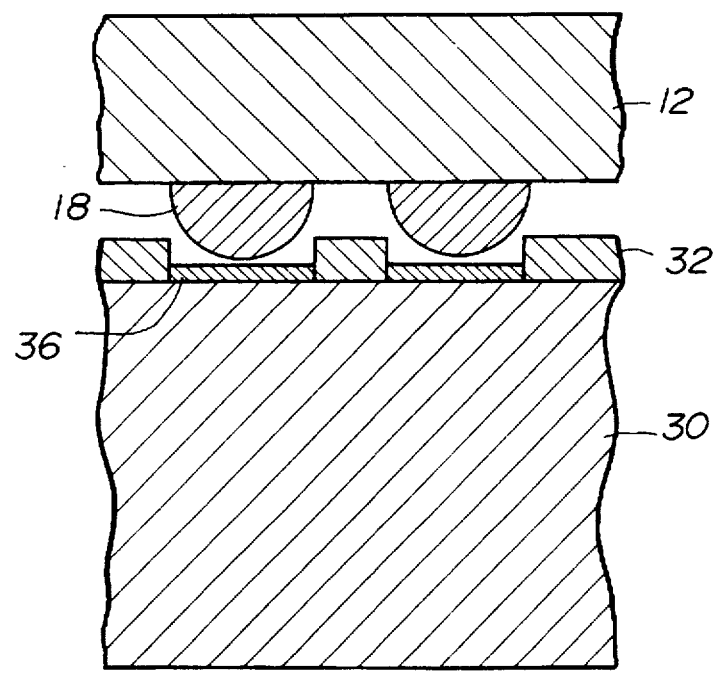
FIG. 5 shows a partial sectional view of a wiring substrate in a second embodiment of the present invention and a BGA-type semiconductor device mounted on the wiring substrate.

FIG. 5 shows a partial sectional view of a second embodiment of the present invention. The same reference numerals are given to parts identical to those shown in FIG. 4. The second embodiment has features in a structure of a wiring substrate 30, whereby positioning of the BGA-type semiconductor device on the wiring substrate 30 can be performed easily and surely.

Lands 36 of copper or the like are formed on the wiring substrate 30 of glass epoxy or the like. A resist layer 32 is formed between each adjacent lands 36 and has a height (thickness) larger than those of the lands 36. Thereby, a projection is formed between each adjacent lands 36 and a respective solder bump 18 may be fitted into a concave space between each adjacent projections. Thus, the positioning can easily be performed. As a result, it is possible to mount the BGA-type semiconductor device 12 onto the wiring substrate 30 not only automatically but also manually.

Further, by using such a mounting structure, the BGA-type semiconductor device 12 is prevented from being displaced on the wiring substrate 30 after being mounted thereon. Thereby, a work can easily be performed on the BGA-type semiconductor device 12 and the wiring substrate 30 in the mounted state. Further, because a resist layer 32 is inserted between each adjacent solder bumps 18, extra solder connecting adjacent solder bumps 18 can be prevented, that is, a so-called bridge can be prevented from occurring. Further, it is possible to perform the mounting work only using flux without using soldering paste printed.

As an example, in a case where a thickness of each land 36 is 50 through 80 μm, a thickness of each resist layer 32 is around 100 through 200 μm.

Figure 6:
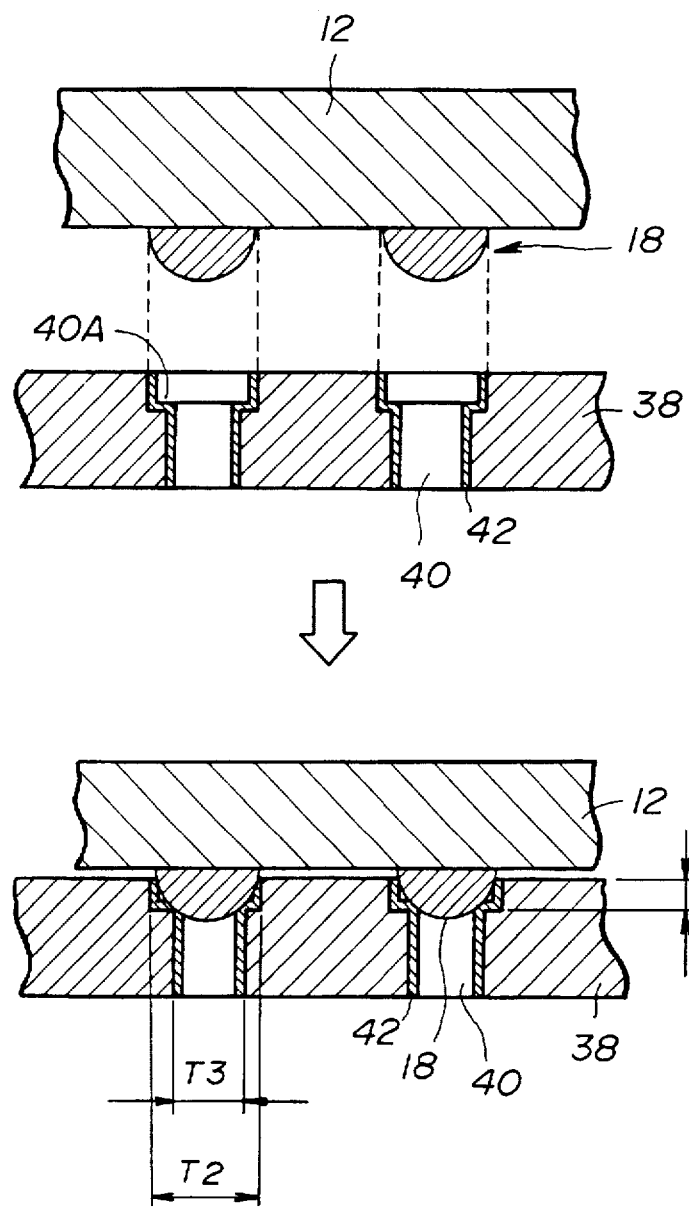
FIG. 6 shows a partial sectional view of a wiring substrate in a third embodiment of the present invention and a BGA-type semiconductor device mounted on the wiring substrate.

A third embodiment of the present invention will now be described. FIG. 6 shows partial sectional view of the third embodiment of the present invention. The third embodiment has features in a structure of a wiring substrate 38, whereby positioning of the BGA-type semiconductor device on the wiring substrate 38 can be performed easily and surely.

A plurality of through holes 40 are formed in the wiring substrate 38 of glass epoxy or the like. Each of the through holes 40 has a connection electric conductor 42 formed inside the through hole 40 as a result of copper plating or the like. Each through hole 40 has a diameter difference portion 40a. Specifically, a diameter T2 of each through hole 40 at the mounting surface (front surface) of the wiring substrate 38 is equal to or slightly larger than a maximum diameter of each solder bump 18. A depth T1 of the diameter difference portion 40a is smaller than a height of each solder bump 18.

Further, a diameter T3 of an inner portion of each through hole 40 is smaller than the maximum diameter of each solder bump 18.

When the BGA-type semiconductor device 12 is mounted onto the wiring substrate 38, the solder bumps 18 are engaged with the diameter difference portions 40a of the through holes 40 respectively. Thereby, the positioning can easily be performed. As a result, it is possible to mount the BGA-type semiconductor device 12 onto the wiring substrate 38 not only automatically but also manually. Further, by using such a mounting arrangement, the BGA-type semiconductor device 12 is prevented from being displaced on the wiring substrate 38 after being mounted thereon. Thereby, a work can easily be performed on the BGA-type semiconductor device 12 and the wiring substrate 38 in the mounted state. Further, after the soldering of the solder bumps 18 to the connection electric conductors 40 respectively, it is possible to observe an inside portion of each through hole 40 from the rear surface of the wiring substrate 38. Thus, whether or not the soldering has been performed sufficiently can be determined. Further, soldering is performed in which, for example, a squeegee is used for applying soldering paste to each through hole 40 around the mounting surface of the wiring substrate 38, and the BGA-type semiconductor device 12 is fixed onto the wiring substrate 38 by soldering after being mounted on the wiring substrate 38.

Figure 7:
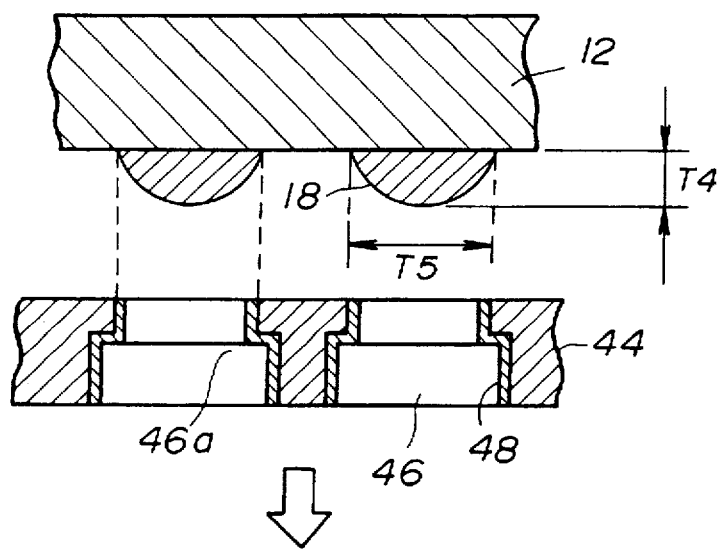
FIG. 7 shows a partial sectional view of a wiring substrate in a fourth embodiment of the present invention and a BGA-type semiconductor device mounted on the wiring substrate.
Figure 7:
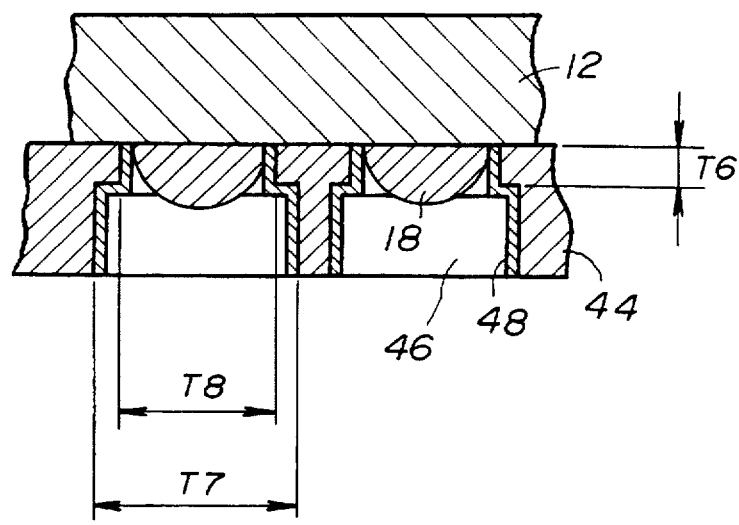

FIG. 7 shows partial sectional views of a fourth embodiment of the present invention. The fourth embodiment has features in a structure of a wiring substrate 44, whereby positioning of the BGA-type semiconductor device on the wiring substrate 44 can be performed easily and surely. Each through hole 46 of the wiring substrate 44 has a diameter difference portion 46a different from each of the diameter difference portions 40a of the third embodiment.

The plurality of through holes 46 are formed in the wiring substrate 44 of glass epoxy or the like. Each of the through holes 46 has a connection electric conductor 48 formed inside the through hole 46 as a result of copper plating or the like. Each through hole 46 has the diameter difference portion 46a in the mounting surface side of the wiring substrate 44. A diameter T8 of each through hole 46 at the mounting surface of the wiring substrate 44 is approximately equal to or slightly larger than the maximum diameter T5 of each solder bump 18. A depth T6 of the diameter difference portion 46a of the diameter T8 is smaller than the height T4 of each solder bump 18. Further, a diameter T7 at an inner portion of each through hole 46 is larger than the maximum diameter T5 of each solder bump 18.

When the BGA-type semiconductor device 12 is mounted onto the wiring substrate 44, the solder bumps 18 are engaged with the diameter difference portions 46a of the through holes 46 respectively. Thereby, the positioning can easily be performed. As a result, it is possible to mount the BGA-type semiconductor device 12 onto the wiring substrate 44 not only automatically but also manually. Further, by using such a mounting arrangement, the BGA-type semiconductor device 12 is prevented from being displaced on the wiring substrate 44 after being mounted thereon. Thereby, a work can easily be performed on the BGA-type semiconductor device 12 and the wiring substrate 44 in the mounted state. Further, after the soldering of the solder bumps 18 to the connection electric conductors 48 respectively, it is possible to observe an inside portion of each through hole 46 from the rear surface of the wiring substrate 44. Thus, whether or not the soldering has been performed sufficiently can be determined. Further, soldering is performed in which, for example, a squeegee is used for applying soldering paste to each through hole 46 around the mounting surface of the wiring substrate 44, and the BGA-type semiconductor device 12 is fixed onto the wiring substrate 44 by soldering after being mounted on the wiring substrate 44.

Figure 8:
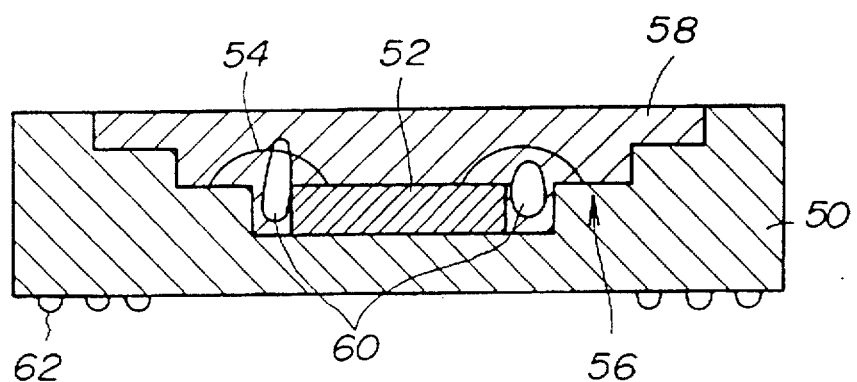
FIG. 8 shows a sectional view of a BGA-type semiconductor device in the related art.
Figure 9:
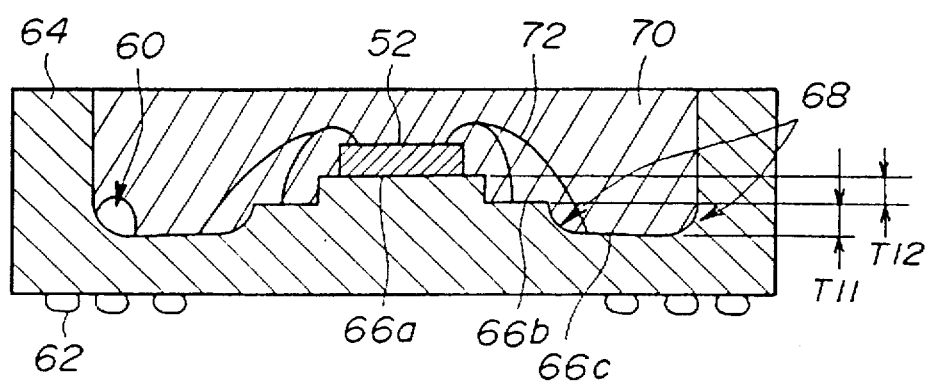
FIG. 9 shows a sectional view of a semiconductor device in a fifth embodiment of the present invention.

With reference to FIG. 9, a fifth embodiment of the present invention will now be described. The fifth embodiment has an arrangement whereby, when an electronic component such as a semiconductor chip supported on a base is sealed by resin, voids formed inside the resin is prevented from adversely affecting bonding wires. Before describing the fifth embodiment with reference to FIG. 9, the above-mentioned problem will now be described with reference to FIG. 8.

FIG. 8 shows a sectional view of a BGA-type semiconductor device in the related art. The base (also referred to as a package, circuit substrate or the like) 50 has a multiple layer structure containing electric conductor layers and insulation layers, and has a stair-shaped concavity as shown in the figure. A bare semiconductor chip 52 is fixed on the bottom of the concavity.

A bonding pad (not shown in the figure) is provided on a step surface 56 of the stair-shaped concavity, and is connected with a bonding pad of the semiconductor chip 52 via a bonding wire 54. The bonding pad on the step surface 56 is electrically connected with a ball-shaped solder bump 62 provided on the bottom surface of the base 50 via wiring layers and through holes (not shown in the figure). The concavity of the base 50 is sealed by resin 58.

In such a case of sealing by resin as that shown in FIG. 8, it is likely that voids 60 occur in the resin 58 in a gap between the semiconductor chip 52 and the base 50. Such a void occurrence in this position may result in an abnormal stress occurring at a wire connection portion of a bonding wire due to a heat stress or the like, whereby a wire break may occur.

The fifth embodiment shown in FIG. 9 solves the above-described problem. A base 64 has a multiple layer structure having electric conductor layers and insulation layers and has a stair-shaped concavity. However, differently from the structure shown in FIG. 8, a surface 66a on which the semiconductor chip 52 is mounted is provided at a highest position as shown in FIG. 9. Surfaces 66b and 66c on which bonding pads are provided are provided at positions lower than that of the chip mounting surface 66a. These bonding pads are electrically connected with the bonding pads of the semiconductor chip 52 via bonding wires 72.

Because the bonding pads on the base 64 are provided at the positions lower than that of the chip mounting surface 66a, the semiconductor chip 52 and a surrounding thereof can be sufficiently distant from the base 64. In the arrangement shown in FIG. 9, a void 60 may occur in a resin 70 at a position shown in the figure. However, even if the void 60 is present there, it does not adversely affect the bonding wires 72. Further, corner portions 68 shown in FIG. 9 are rounded as shown in the figure. As a result, occurrence of voids can be sufficiently restricted.

Thus, the fifth embodiment of the present invention has the arrangement whereby voids can be prevented from occurring around bonding wire connection portions. As a result, a wire connection reliability can be improved.

In the fifth embodiment shown in FIG. 9, it is possible that the solder bumps 62 are provided at a reverse side of the base 64.

With reference to FIGS. 10A, 10B, 11A and 11B, a sixth embodiment of the present invention will now be described.

The sixth embodiment has features in a structure of a base (package), whereby a manufacturing process can be simplified and costs of products can be reduced.

When the semiconductor device shown in FIG. 8 is manufactured, parts are mounted, wire bonding is performed and resin sealing is performed for each base 50. In contrast to this, in the sixth embodiment, a plurality of bases are integrally handled, parts are mounted, wire bonding is performed and resin sealing is performed thereon. Then, finally, the integral plurality of bases are divided into individual bases.

First, V-shaped grooves 74 are formed on two sides of a fixed-size substrate 72 and thus a plurality of bases 72A are defined. One base indicated by hatching in each of FIGS. 10A and 10B corresponds to a base indicated by hatching in FIG. 11A. The fixed-size substrate 72 has an arrangement, for example, in which, as shown in FIG. 10A, a stacked plurality of glass epoxy substrates II having wiring patterns formed on surfaces thereof are mounted on a base part I via an adhesive resin sheet.

Figure 10A:
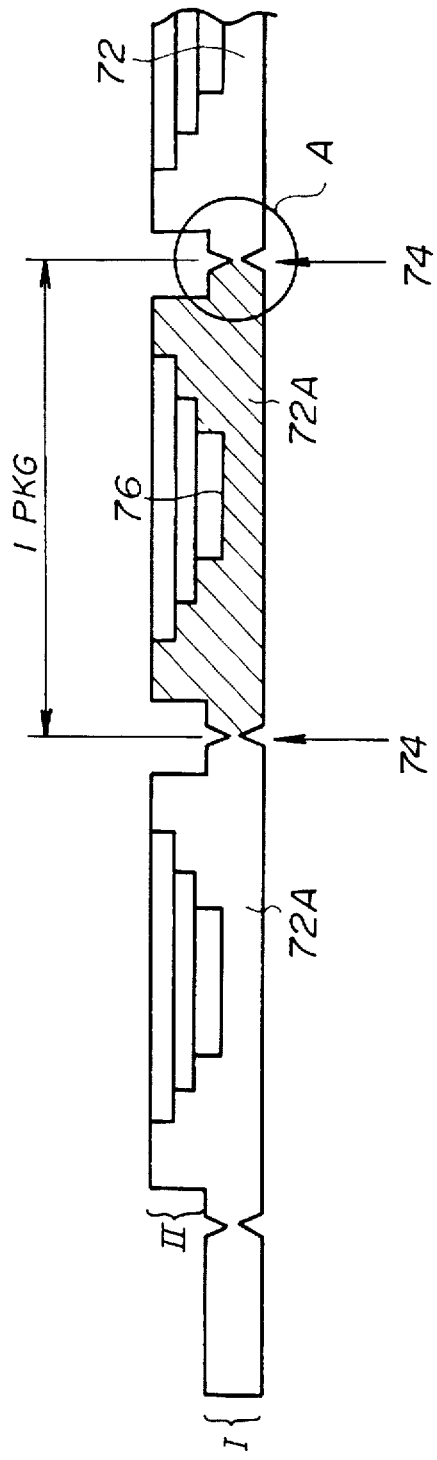
FIGS. 10A and 10B show sectional views indicating a sixth embodiment of the present invention.
Figure 11A:
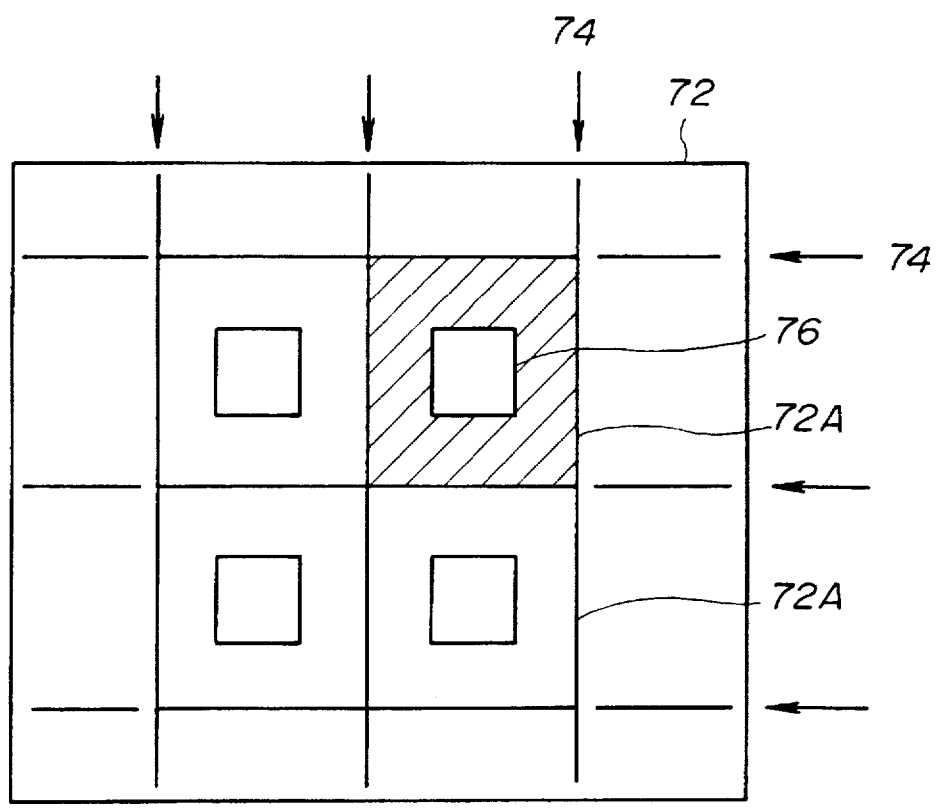
FIGS. 11A and 11B show plan views indicating the sixth embodiment of the present invention.
Figure 11B:
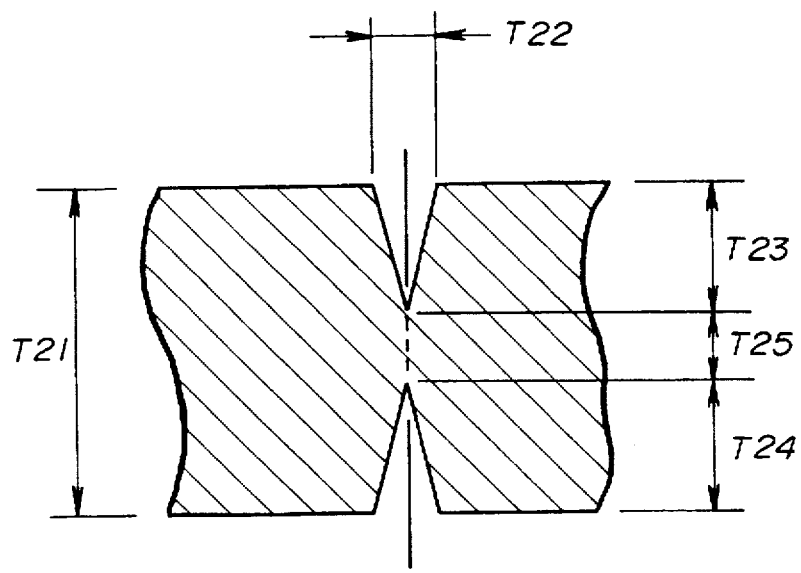

FIG. 11B shows a detail of a V-shaped groove 74 at a portion A shown in FIG. 10A. T21=T23+T24+T25, and T23=T24>T25, where T21 is a thickness of the base part I. Further, T22 is a width of the V-shaped groove at the surface of the base part I. The width and depth of the V-shaped groove can be arbitrarily decided appropriate for easy formation of the V-shaped groove 74 by a cutting work during the manufacturing process.

Figure 10B:
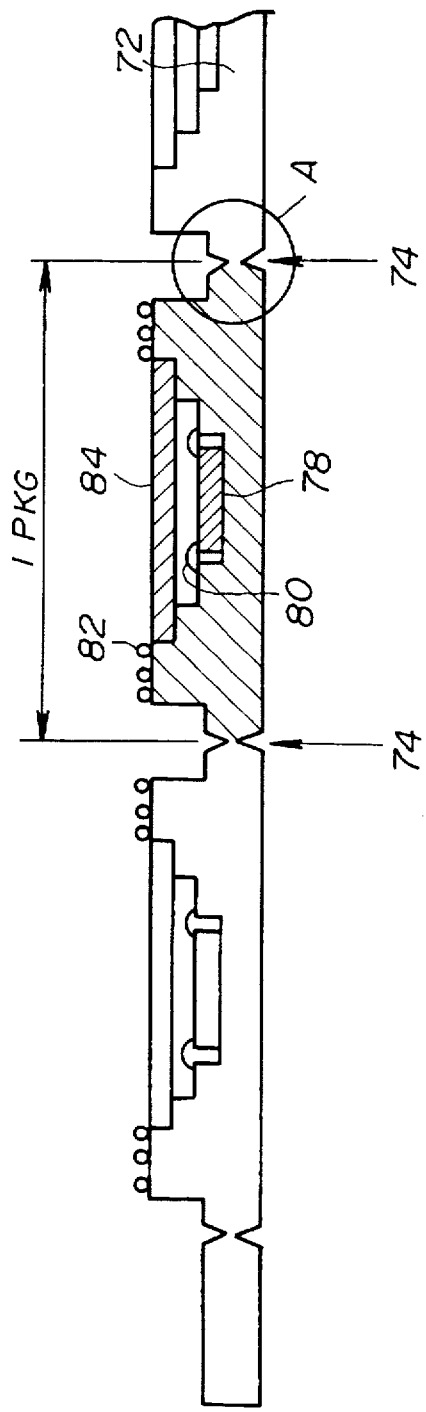

After forming the fixed-size substrate 72 shown in FIG. 10A, a semiconductor chip 78 is fixed on a mounting surface 76 using an Ag epoxy adhesive or the like as shown in FIG. 10B. Then, bonding wires 80, solder bumps 82 and a lid 84 are provided. Further, if necessary, a radiator fin may be provided. A sequence of steps in which the state shown in FIG. 10A is gradually changed into the state shown in FIG. 10B can be arbitrarily decided in consideration of various conditions. Finally, the fixed-size substrate 72 is cut along the V-shaped grooves 74. Thus, individual BGA-type semiconductor devices are completed.

In order to achieve the above-described manufacturing process from the state shown in FIG. 10A to the state shown in FIG. 10B, only a manufacturing line which enables the fixed-size substrate 72 flowing therethrough is required. Thus, it is possible to simplify the manufacturing line.

A seventh embodiment of the present invention will now be described. The seventh embodiment has a structure whereby it is easy to remove a BGA-type semiconductor device from a wiring substrate after the former has been mounted on the latter.

In the related art, it is relatively easy to remove a lead-using component such as a QFP-type semiconductor device from a wiring substrate after mounting the former to the latter. For example, by applying a hot window blast or a hot bar to a lead portion, a lead-using component can be removed from the wiring substrate. However, a BGA-type semiconductor device has connection portions also inside the device. Accordingly, when the BGA-type semiconductor device will be removed from a wiring substrate after the former is mounted on the latter, if a hot window blast is used for this purpose, a great heat stress may be applied to the BGA-type semiconductor and wiring substrate. Further, it is not possible to apply a hot bar to an internal connection portion.

Figure 12A:
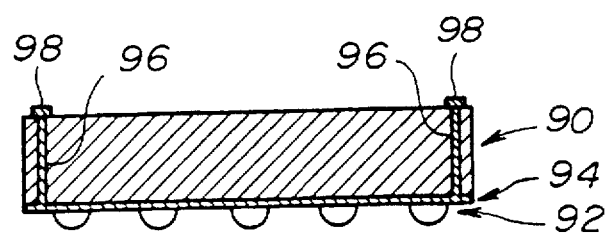
FIGS. 12A and 12B show a semiconductor device in a seventh embodiment of the present invention.
Figure 12B:
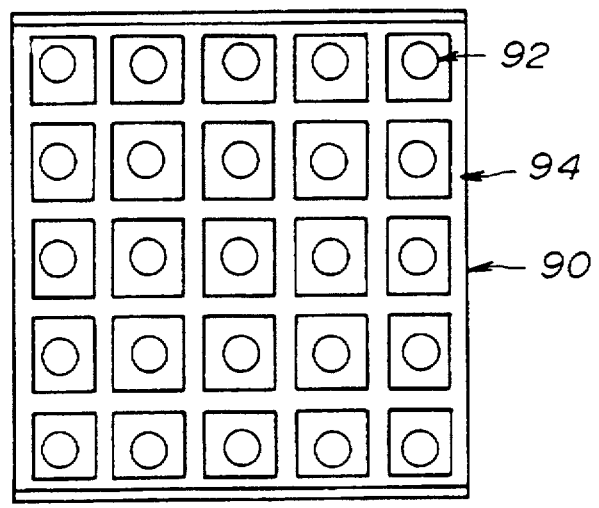

FIGS. 12A and 12B illustrate the seventh embodiment of the present invention. In detail, FIGS. 12A and 12B show a sectional view and a bottom view of a BGA-type semiconductor device, respectively.

A heat generating circuit pattern 94 is formed on the rear surface (such as the rear surface of the base 64 shown in FIG. 9, for example) of the BGA-type semiconductor device 90 containing an electronic component such as a semiconductor chip, such that the heat generating circuit pattern 94 surrounds ball-shaped solder bumps 92 as shown in FIG. 12B. The heat generating circuit pattern 94 is, for example, a laminated resistance element formed as a result of plating of a heat generating material such as Nichrome (trade mark) or the like. In order to cause the heat generating pattern 94 to generate heat, at least two electric terminals 98 are provided on the top surface (the front surface of the base 64 shown in FIG. 9, for example) of the semiconductor device 90. The electric terminals are connected with the heat generating circuit pattern 94 using through holes 96 having electric conductors provided thereinside.

When removing the BGA-type semiconductor device 90, which has been mounted on a wiring substrate, from the wiring substrate, a power source is connected between the electric terminals 98 and thus the heat generating circuit pattern 94 is caused to generate heat. By this heat generated, solder at a connection portion of the semiconductor device 90 is heated to a melting temperature. As a result, the solder is softened, and thereby the semiconductor device 90 can be removed from the wiring substrate as a result of pulling the former from the latter with an appropriate external pulling force.

If the solder of the semiconductor device 90 completely melts, a circuit pattern on the wiring substrate may be short-circuited. In order to prevent such a problem, it is preferable to control the temperature of the solder and thereby maintain a state in which the solder has a viscosity. The solder viscosity control can be performed not only by controlling the temperature of the solder but also by appropriately selecting materials of the solder.

Figure 13A:
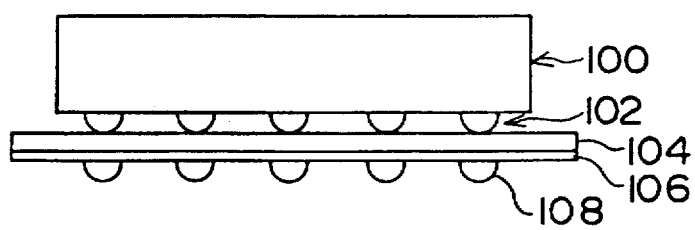
FIGS. 13A, 13B and 13C illustrate an eighth embodiment of the present invention.
Figure 13B:
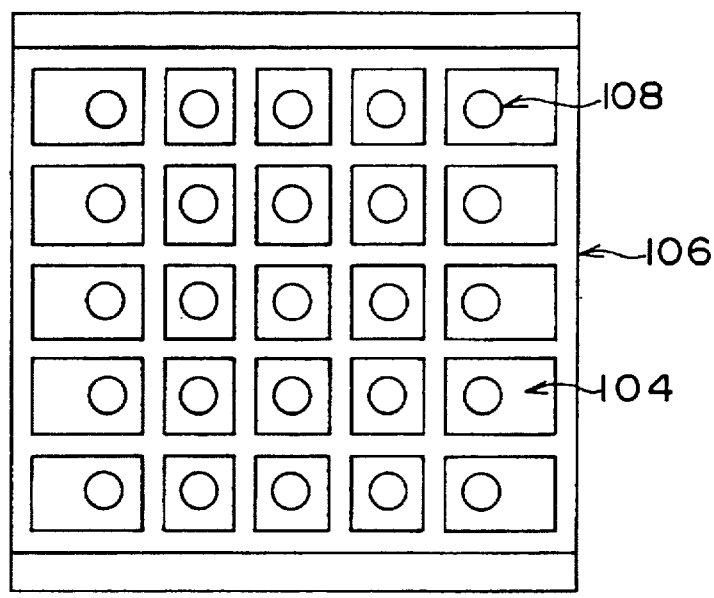
Figure 13C:
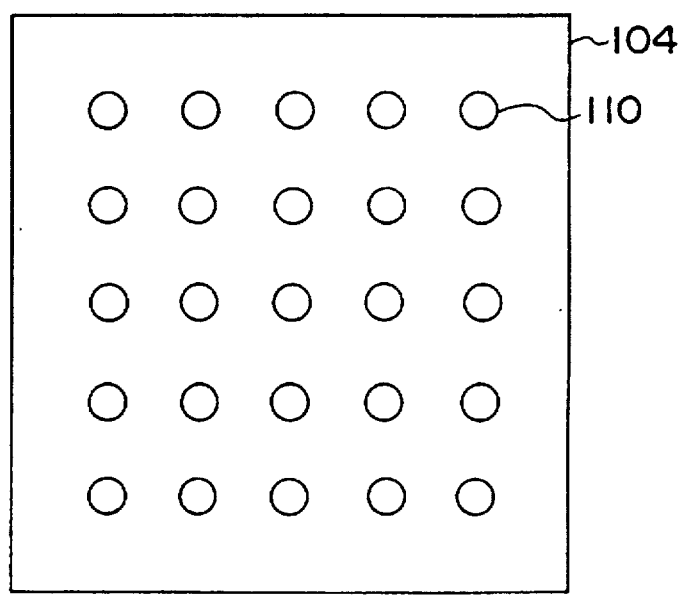

With reference to FIGS. 13A, 13B and 13C, an eighth embodiment of the present invention will now be described. The eighth embodiment uses a principle of the seventh embodiment shown in FIGS. 12A and 12B. In the eighth embodiment, when a BGA-type semiconductor device 100 is mounted onto a wiring substrate (referred to as a real wiring substrate for the sake of convenience in description of the eighth embodiment), a mounting intermediate wiring substrate 104 is inserted therebetween. FIG. 13A shows a state in which the BGA-type semiconductor device 100 is mounted onto the mounting intermediate wiring substrate 104. FIG. 13B shows a bottom surface (at a side with which the mounting intermediate wiring substrate 104 is mounted onto the real wiring substrate) of the mounting intermediate wiring substrate 104, and FIG. 13C shows a top surface (at a side of the semiconductor device 100) of the mounting intermediate wiring substrate 104.

On the top surface of the mounting intermediate wiring substrate 104, lands 110 are provided in positions corresponding to solder bumps 102 of the BGA-type semiconductor device 100. On the bottom surface of the mounting intermediate wiring substrate 104, ball-shaped solder bumps 108 are provided. The lands 110 are electrically connected with the solder bumps 108 via connection electric conductors inside through holes provided in the mounting intermediate wiring substrate 104, respectively.

On the bottom surface of the mounting intermediate wiring substrate 104, a heat generating circuit pattern 106 similar to the above-described heat generating circuit pattern 94 is formed such that the heat generating circuit pattern 106 surrounds the solder bumps 108 as shown in FIG. 13B.

When the BGA-type semiconductor device 100 is mounted onto the real wiring substrate (mother board, not shown in the figures), the semiconductor device 100 is mounted onto the mounting intermediate wiring substrate 104, first. A method of this mounting work is identical to that of a mounting work in which ordinarily a semiconductor device is mounted on a real wiring substrate. Then, the mounting intermediate wiring substrate 104 having the BGA-type semiconductor device 100 mounted thereonto is mounted on the real wiring substrate. A method of this mounting work is identical to that of a mounting work in which ordinarily a semiconductor device is mounted on a real wiring substrate. In this case, if the real wiring substrate has a structure of the wiring substrate of any one of the first through fourth embodiments, the positioning can easily be performed.

In a case where it is necessary to remove the semiconductor device 100 from the real wiring substrate due to malfunction of the semiconductor device 100 after mounting the former to the latter as described above, an electric current is caused to flow through the heat generating circuit pattern 106. Electric terminals are provided to the heat generating circuit pattern 106 at arbitrary positions and are used for flowing electric current through the heat generating circuit pattern 106. It is possible to directly mount the electric terminals to the heat generating circuit pattern 106 easily. As a result of electric current flowing through the heat generating circuit pattern 106, the heat generating circuit pattern 106 generates heat accordingly. By this heat generated, solder of the mounting intermediate wiring substrate 104 is heated to be approximately in a melting temperature. As a result, the solder is softened, and thereby the mounting intermediate wiring substrate 104 can be removed from the real wiring substrate as a result of pulling the former from the latter with an appropriate external pulling force.

Figure 14:
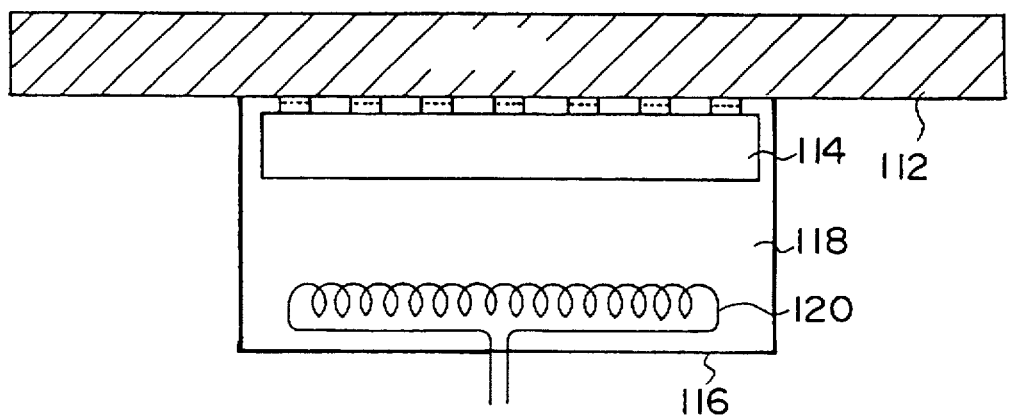
FIG. 14 shows a ninth embodiment of the present invention.

With reference to FIG. 14, a ninth embodiment of the present invention will now be described. The ninth embodiment, similar to the above-described seventh and eighth embodiments, has features whereby a BGA-type semiconductor device can easily be removed from a wiring substrate. Specifically, the ninth embodiment is a method for removing a BGA-type semiconductor device from a wiring substrate.

With reference to FIG. 14, a BGA-type semiconductor device 114 mounted on a wiring substrate 112 is dipped in a dip tank 116 which is filled with molten solder 118. A heater 120 is provided in the dip tank 116 and a temperature of the solder in the dip tank 116 is maintained at a melting point as a result of flowing an electric current through the heater 120. In this condition, the BGA-type semiconductor device 114 is heated and thereby a solder connection portion of the semiconductor device 114 at which the semiconductor device 114 is connected with the wiring substrate 112 has a temperature higher than the melting point of the solder of the solder connection portion. Thereby, the solder connection portion starts melting and thereby the semiconductor device 114 can be removed from the wiring substrate 112.

Figure 15:
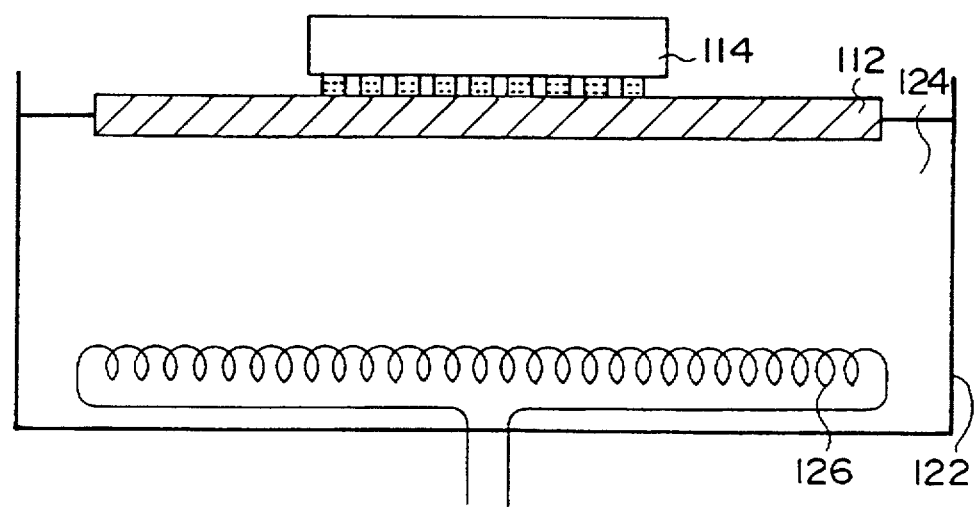
FIG. 15 shows a variant example of the ninth embodiment of the present invention.

FIG. 15 shows a variant example of the method shown in FIG. 14. In a method shown in FIG. 15, the wiring substrate 112 is dipped in a dip tank 122 filled with molten solder 124. A heater 126 is provided in the dip tank 122 and a temperature of the solder in the dip tank 122 is maintained at a melting point as a result of flowing an electric current through the heater 126. In this condition, the BGA-type semiconductor device 114 is heated via the wiring substrate 112, and thereby the solder connection portion of the semiconductor device 114 at which the semiconductor device 114 is connected with the wiring substrate 112 has a temperature higher than the melting point of the solder of the solder connection portion. Thereby, the solder connection portion starts melting and thereby the semiconductor device 114 can be removed from the wiring substrate 112.

Hereinbefore, the embodiments of the present invention have been described. It is possible to arbitrarily combine above-mentioned embodiments of the present invention. For example, it is possible to apply the arrangement shown in FIG. 12 to the arrangement shown in FIG. 9.

Further, the present invention is not limited to the above-described embodiments, and variations and modifications may be made without departing from the scope of the present invention.

What is claimed is:

1. A wiring substrate having a semiconductor device mounted thereonto, said semiconductor device having a ball-shaped externally connecting part;

said wiring substrate comprising a through hole at a position corresponding to said ball-shaped externally connecting part and an electric conductor provided inside and around said through hole; and a land portion of said electric conductor, at which said electric conductor is engaged with said externally connecting part, comprising a sectional tapering portion.

2. The wiring substrate according to claim 1, wherein said through hole has a sectional tapering portion at an edge portion in proximity to said land portion.

3. A wiring substrate having a semiconductor device mounted thereonto, said semiconductor device having a ball-shaped externally connecting part;

said wiring substrate comprising a through hole at a position corresponding to said ball-shaped externally connecting part and an electric conductor provided inside and around said through hole; and said through hole comprising a first portion which is engaged with said externally connecting part and a second portion which is provided further into said wiring substrate than said first portion and has a width narrower than that of said externally connecting part.

4. A wiring substrate having a semiconductor device mounted thereonto, said semiconductor device having a ball-shaped externally connecting part;

said wiring substrate comprising a through hole at a position corresponding to said ball-shaped externally connecting part and an electric conductor provided inside and around said through hole; and said through hole comprising a first portion which is engaged with said externally connecting part and a second portion which is provided further into said wiring substrate than said first portion and has a width wider than that of said externally connecting part.

5. A semiconductor device, comprising:

an electronic component;

a base supporting said electronic component and a pad;

an externally connecting part mounted on said base and electrically connected with said electronic component;

a bonding wire connecting between said electronic component and said pad; and a resin sealing said electronic component;

wherein said base comprises a first surface at which said electronic component is mounted and a second surface at which said pad is formed; and said second surface is lower than said first surface.

6. The semiconductor device according to claim 5, wherein said base further comprises a third surface at which another pad is provided, said third surface being lower than said second surface.

7. The semiconductor device according to claim 6, wherein a corner portion of said base at which said third surface borders another surface is rounded.

* * * * *

UNITED STATES PATENT AND TRADEMARK OFFICE
CERTIFICATE OF CORRECTION

PATENT NO.: 5,783,865
DATED    : July 21, 1998
INVENTOR(S): Yutaka HIGASHIGUCHI et al.

It is certified that error appears in the above-identified patent and that said Letters Patent is hereby corrected as shown below:

On the title page, [73] Assignee, after "Fujitsu Limited" insert --Kawasaki, Japan--.

Signed and Sealed this

Seventh Day of December, 1999

Attest:

Q. TODD DICKINSON

Attesting Officer        Acting Commissioner of Patents and Trademarks